United States Patent [19]

Kuriyama

[11] Patent Number: 5,818,080
[45] Date of Patent: Oct. 6, 1998

[54] SEMICONDUCTOR MEMORY DEVICE INCLUDING A MEMORY CELL REGION OF SIX TRANSISTORS

[75] Inventor: Hirotada Kuriyama, Hyogo, Japan

[73] Assignee: Mitsubishi Denki Kabushiki Kaisha, Tokyo, Japan

[21] Appl. No.: 601,554

[22] Filed: Feb. 14, 1996

[30] Foreign Application Priority Data

Jul. 31, 1995 [JP] Japan ................................. 7-194899

[51] Int. Cl.[6] .............................................. H01L 29/788
[52] U.S. Cl. .......................... 257/315; 257/369; 257/371; 257/380; 257/393; 365/154; 365/174
[58] Field of Search ................................ 257/393, 315, 257/369, 368, 371, 377, 379, 380; 365/154, 174

[56] References Cited

U.S. PATENT DOCUMENTS

| | | | |
|---|---|---|---|
| 5,166,902 | 11/1992 | Silver | 365/182 |
| 5,341,327 | 8/1994 | Kuriyama | 365/154 |
| 5,382,807 | 1/1995 | Tsutsumi et al. | 257/69 |
| 5,404,326 | 4/1995 | Okamoto | 365/156 |
| 5,486,717 | 1/1996 | Kokubo et al. | 257/385 |
| 5,572,469 | 11/1996 | Anami et al. | 365/189.11 |

OTHER PUBLICATIONS

Fumitomo Matsuoka et al, "High–Denisty Full–CMOS SRAM Cell Technology with a Deep Sub–Micron Spacing between nMOS and pMOSFET," IEICE Trans. Election., vol. E77–C, No. 8, Aug. 1994, pp. 1385–1394.

Primary Examiner—William Mintel
Attorney, Agent, or Firm—Lowe, Price, LeBlanc & Becker

[57] ABSTRACT

A semiconductor memory device is provided that can have the memory cell size reduced and electrical imbalance eliminated. This semiconductor memory device has gate electrodes of a driver transistor and a load transistor formed of a first polysilicon layer, and a word line also serving as a gate electrode of an access transistor formed of a different layer of a second polysilicon layer. Therefore, the gate electrodes of the driver transistor and the load transistor can be overlapped with each other in a planar manner with the word line, resulting in reduction in the planar area of the memory cell. In a cell current path, a contact portion other than a bit line contact and a GND contact is not provided. Therefore, electrical imbalance in memory cells is prevented.

8 Claims, 20 Drawing Sheets

SEMICONDUCTOR MEMORY DEVICE INCLUDING A MEMORY CELL REGION OF SIX TRANSISTORS

BACKGROUND OF THE INVENTION

1. Field of the Invention

The present invention relates to semiconductor memory devices, and more particularly, to a structure of a static random access memory (referred to as SRAM hereinafter).

2. Description of the Background Art

As shown in FIG. 19, a memory cell of a conventional SRAM includes a total of six elements i.e. four N type transistors (two access transistors Q1 and Q2, and two driver transistors Q3 and Q4), and two P type transistors (load transistors Q5 and Q6) for a total of six elements. Since the six transistors are formed on the surface of a semiconductor substrate, the cell size is disadvantageously increased.

Conventionally, a TFT (Thin Film Transistor) is used as a P type transistor to form four elements on the surface of the semiconductor substrate and two elements of the TFT above the semiconductor substrate to reduce the cell size.

It has become difficult to obtain a stable operation at a low voltage of not more than 3 V using a TFT load. This is because favorable current performance of a TFT cannot be obtained at a low voltage. The use of a P type transistor formed on the surface of a semiconductor substrate of favorable current performance is proposed for the purpose of achieving stable operation at a low voltage. This is disclosed in, for example, IEICE TRANS. ELECTRON., VOL. E77-C, NO. 8 AUGUST 1994, pp. 1385–1394.

A layout of a memory cell of a SRAM disclosed in this document is shown in FIGS. 20 and 21. Referring to FIG. 20, a conventional memory cell disclosed in this document includes two access transistors Q1 and Q2 of N type MOS transistors at a main surface of a semiconductor substrate (not shown), two driver transistors Q3 and Q4 of N type MOS transistors, and two load transistors Q5 and Q6 of P type MOS transistors. An N type MOS active region 1 is provided to form the source/drain region of an N type MOS transistor. A P type MOS active region 6 is provided to form the source/drain region of a P type MOS transistor.

A trench isolation region 203 is formed in a region other than where N type MOS active region 1 and P type MOS active region 6 are formed on the surface of the semiconductor substrate. A word line 3 is formed of a first polycide layer also forming the gate electrodes of access transistors Q1 and Q2. Also, a gate electrode 3b of driver transistor Q3 and load transistor Q5, and a gate electrode 3c of driver transistor Q4 and load transistor Q6 are both formed of the first polycide layer. First polycide layers 3b and 3c are connected to active regions 1 and 6 by a first polycontact 7. Furthermore, a second polycide layer that will be described afterwards is connected to active regions 1 and 6 by a second polycontact 8.

FIG. 21 is a conceivable diagram not actually disclosed, but that can be derived from the aforementioned document. A GND wiring 9b formed of a second polycide layer is connected to active region 1 (refer to FIG. 20) via a second polycontact 8. A Vcc wiring 9c formed of a second polycide layer is connected to PMOS active region 6 via second polycontact 8. In NMOS active region 1 of access transistors Q1 and Q2, a pad layer 9a of the second polycide layer is formed via second polycontact 8. Pad layer 9a and a pair of bit lines 10 formed of a metal wiring are connected via contact 11.

FIG. 22 is an equivalent circuit diagram corresponding to the layout of FIGS. 20 and 21, and FIG. 23 is a general rewritten equivalent circuit virsion of the equivalent circuit of FIG. 22. Referring to FIGS. 22 and 23, the node of access transistor Q1 and driver transistor Q3 is a storage node 12. The node between access transistor Q2 and driver transistor Q4 is a storage node 13. There is no first polycontact 7 in a current path I1. In contrast, two first polycontacts 7 are present in a current path I2.

FIG. 24 is a sectional view of the memory cell of FIG. 20 taken along line 200—200. Referring to FIG. 24, an N⁻ well 202 and a P⁻ well 201 are formed adjacent to each other on the surface of a semiconductor substrate 201 corresponding to a PMOS region and an NMOS region, respectively. A trench isolation 203 is formed at the main surface of semiconductor substrate 201 except where active regions 1 and 6 are formed. Furthermore, a p⁺ impurity region 205 forming the source/drain region of load transistor Q6 is provided at a predetermined region of the main surface of N⁻ well 202. An n⁺ impurity region 204 forming the source/drain region of driver transistor Q4 is provided at a predetermined region of the main surface of P⁻ well 201. An oxide film 206 is formed on the main surface of semiconductor substrate 201. First polycontact 7 is formed in a region of oxide film 206 located above p⁺ and n⁺ impurity regions 205 and 204.

A third gate electrode 3b of the first polycide layer is formed in first polycontact 7 to electrically connect p⁺ impurity region 205 and n⁺ impurity region 204, and to extend along the main surface of oxide film 206. Gate electrode 3b includes an n type polysilicon layer 30, a p type polysilicon layer 31 formed integral with n type polysilicon layer 30, and a WSi layer 32 formed on the surface of n type polysilicon layer 30 and p type polysilicon layer 31. Such a structure having a gate electrode of a PMOS transistor formed of a P type polysilicon layer 31 and a gate electrode of an NMOS transistor formed of an N type polysilicon layer 30 is called a dual gate transistor. When this dual gate transistor employs an N type polysilicon layer as the gate electrode of a conventional PMOS transistor, the formation of a PN junction at the connection of the N type polysilicon layer and p⁺ impurity region 205 of the P type transistor is prevented.

As shown in FIG. 23, the above-described conventional SRAM includes no first polycontact 7 in current path I1 and two first polycontacts 7 in current path I2. This means that current path I2 has a contact resistance greater than that of current path I1 by the two first polycontacts 7. Therefore, the current flowing across current path I2 is smaller than that flowing across current path I1. As a result, a readout is delayed when current flows at the current path I2 side (when storage node 13 has a L data). Disadvantageously, an imbalance occurs in the electric characteristics due to different resistances between current path I1 and current path I2 in a conventional memory cell.

Since gate electrode 3a of access transistors Q1 and Q2, gate electrode 3b of driver transistor Q3 and load transistor Q5, and gate electrode 3b of driver transistor Q4 and load transistor Q6 are formed of a first polycide layer in the memory cell of the conventional SRAM shown in FIGS. 21 and 22, it is not possible to overlap gate electrodes 3a, 3b and 3c. Therefore, it was difficult to reduce the memory size.

Furthermore, since the memory cell of a conventional SRAM has a dual gate transistor structure of a P type polysilicon layer 31 and an N type polysilicon layer 30 as shown in FIG. 24, boron from P type polysilicon layer 31 disadvantageously penetrated through gate oxide film 206. In this case, the threshold voltage of the P type transistor is undesirably altered.

In the dual gate transistor shown in FIG. 24, the P type impurities i.e., boron, in P type polysilicon layer 31 are easily diffused to the upper WSi layer 32. Disadvantageously boron is introduced into the N type polysilicon layer thereby varying the threshold voltage $V_{TH}$ and undesirably altering the resistance value of the gate electrode. In order to solve this problem, an approach is proposed of suppressing boron diffusion by providing an amorphous silicon layer (not shown) between the lower polysilicon layer 31 and the upper WSi layer 32. However, this approach induces another problem in that additional processing is required to form an amorphous silicon layer. The formation of an amorphous silicon layer results in an increase in the height of gate electrode 3b to become a bottleneck in reducing the step portion for a thinner gate electrode. Therefore, offset in focus in forming a fine pattern by photolithography becomes greater to reduce the focus margin.

SUMMARY OF THE INVENTION

An object of the present invention is to provide a semiconductor memory device with a reduced memory cell size.

Another object of the present invention is to provide a semiconductor memory device without an electrical imbalance of a memory cell.

Another object of the present invention is to provide a semiconductor memory device that can suppress variation in threshold voltage caused by usage of a dual gate.

Still another object of the present invention is to provide a semiconductor memory device that has a fewer number of layers forming a memory cell region.

A still further object of the present invention is to provide a semiconductor memory device with a reduced distance between adjacent memory cells.

A semiconductor device according to an aspect of the present invention includes two driver transistors, two access transistors, and two load transistors formed on a main surface of a semiconductor substrate located at a memory region. This semiconductor memory device includes a first conductive layer and a second conductive layer. The first conductive layer forms the gate electrode of the driver transistor and the gate electrode of the load transistor, and includes at least a first polysilicon layer. The second conductive layer forms a word line also serving as the gate electrode of the access transistor, a power supply wiring, and a connection wiring for connecting an active region of a first conductivity type transistor forming the driver transistor and the access transistor with an active region of a second conductivity type transistor forming the load transistor. The second conductive layer includes at least a second polysilicon layer. Since the semiconductor memory device has the gate electrodes of the driver transistor and the load transistor formed of the first conductive layer, and the word line serving as the gate electrodes of the access transistor formed of the second conductive layer, the first and second conductive layers can be overlapped with each other in a planar manner. Therefore, the cell size can be reduced in comparison to the conventional case where all the gate electrodes of the six transistors are formed of one conductive layer.

In a semiconductor memory device according to another aspect of the present invention, a current path of a memory cell includes a first contact portion for a bit line and a second contact portion for a ground wiring. The current path includes a contact unit of only the first and second contact portions. Therefore, there is no imbalance in the number of contact portions between two current paths. The disadvantage of different resistance values between two current paths does not occur. Thus, the problem of electrical imbalance in the memory cell is eliminated.

A semiconductor memory device according to a further aspect of the present invention includes a first storage node and a second storage node. The first storage node is located at the node of one driver transistor, one load transistor, and one access transistor. The second storage node is located at the connection of the other driver transistor, the other load transistor, and the other access transistor. A polysilicon contact portion located in a memory cell region of this semiconductor memory device is arranged electrically symmetric on an equivalent circuit with respect to the first and second storage nodes. As a result, the electrical imbalance of the memory cells is eliminated.

A semiconductor memory device according to still another aspect of the present invention includes a first conductivity type transistor, a second conductivity type transistor, and a polycide layer. The first conductivity type transistor includes a driver transistor and an access transistor. The second conductivity type transistor includes a load transistor. The polycide layer is formed of a polysilicon layer and a metal silicide layer. The polycide layer serves to connect a first active region of the first conductivity type transistor with a second active region of the second conductivity type transistor. The metal silicide layer of the polycide layer is directly connected to the first and second active regions, and the polysilicon layer of the polycide layer is not directly connected to the first and second active regions. Therefore, it is not necessary to employ a dual gate for the purpose of preventing formation of an PN junction. The problem generally due to usage of a dual gate such as variation in the threshold voltage is eliminated.

A semiconductor memory device according to a still further aspect of the present invention includes a first conductive layer, a second conductive layer, and a metal wiring layer. The first conductive layer is constituted of a gate electrode of a driver transistor, a gate electrode of a load transistor, a word line also serving as the gate electrode of an access transistor, and a connection wirings for connecting a first active region of a first conductivity type transistor forming the driver transistor and the access transistor with a second active region of a second conductivity type forming the load transistor. The first conductive layer includes at least a first polysilicon layer. The second conductive layer includes at least a second polysilicon layer, and forms a power supply wiring and a connection wiring within a memory cell region. The metal wiring layer forms a bit line and a ground wiring. Since the semiconductor memory device has a memory cell formed of the first conductivity layer including the first polysilicon layer, the second conductive layer including the second polysilicon layer and the metal wiring layer, the number of layers forming a memory cell can be reduced in comparison with that of a conventional memory cell formed of three conductive layers of polysilicon layer and one metal wiring layer.

A semiconductor memory device according to yet another aspect of the present invention includes a conductive layer, a first metal wiring layer, and a second metal wiring layer. The conductive layer includes at least a polysilicon layer, and is constituted of a gate electrode of a driver transistor, a gate electrode of a load transistor, a word line also serving as a gate electrode of an access transistor, and a connection wiring for connecting a first active region of a first conductivity type transistor forming the driver transistor and the access transistor with a second active region of a second conductivity type transistor forming the load transistor. The first metal wiring layer forms a power supply wiring and a ground wiring. The second metal wiring layer forms a bit line. Since this semiconductor memory device has a memory cell formed of a one layer first conductive layer including a polysilicon layer and two layers of metal wiring layers, the number of layers forming a memory cell can be reduced in comparison with that of a conventional memory cell formed of three polysilicon layers and one metal wiring layer.

A semiconductor memory device according to yet a still further aspect of the present invention has a first memory cell and a second memory cell formed adjacent to each other on a main surface of a semiconductor substrate. Each of the first and second memory cells includes a load transistor, a driver transistor, and an access transistor. The load transistor is formed of a first field effect transistor on the main surface of the semiconductor substrate, and includes a first gate electrode. The driver transistor is formed of a second field effect transistor on the main surface of the semiconductor substrate, and includes a second gate electrode. The access transistor is formed of a third field effect transistor on the main surface of the semiconductor substrate, and includes a third gate electrodes. An extending line of the first gate electrode of the load transistor in the first memory cell does not overlie an extending line of the first gate electrode of the load transistor in the second memory cell. It is therefore possible to further reduce the distance between adjacent first and second memory cell. As a result, the integration density can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described hereinafter with reference to the drawings.

FIRST EMBODIMENT

Figure 1:
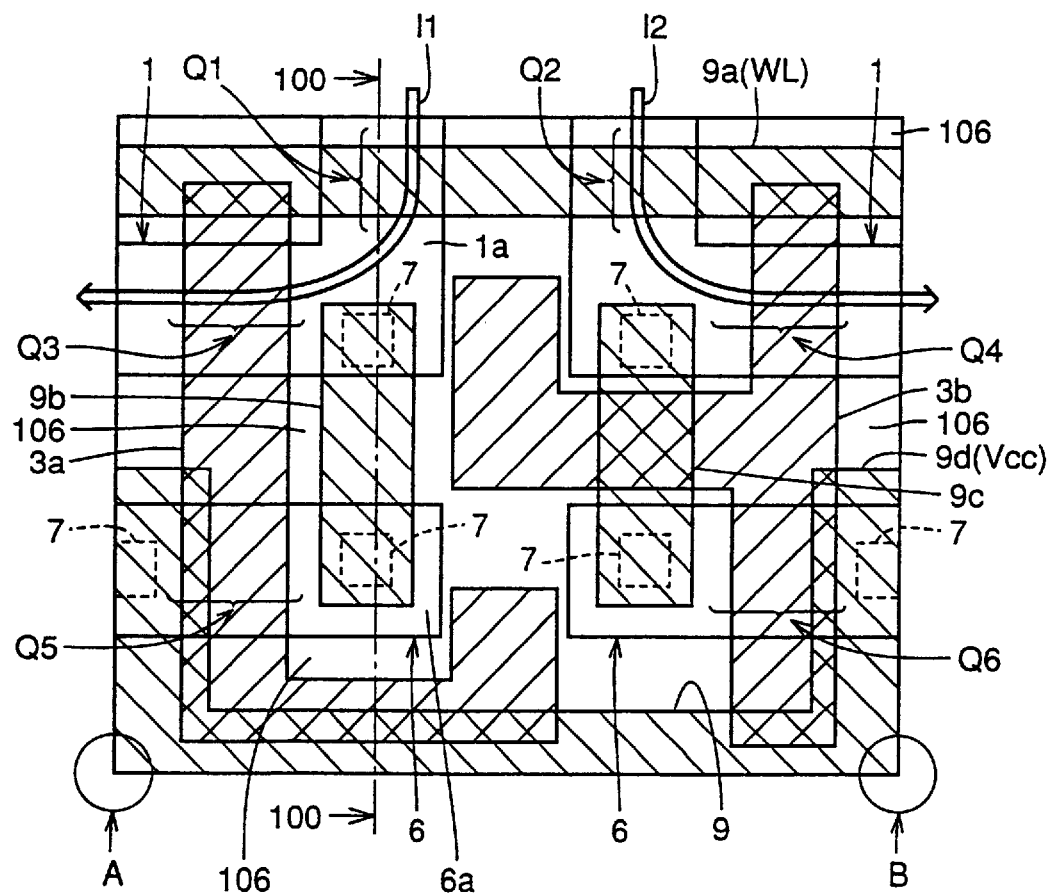
FIGS. 1, 2 and 3 are plan layouts of a memory cell of an SRAM according to a first embodiment of the present invention.
Figure 2:
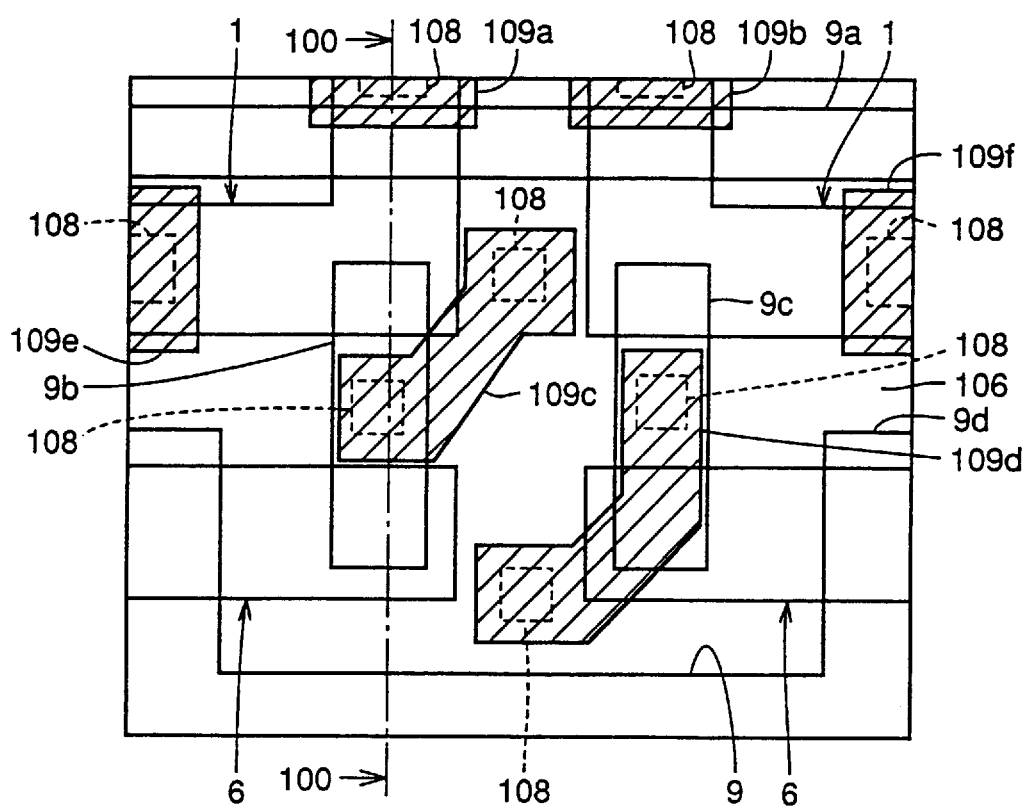
Figure 3:
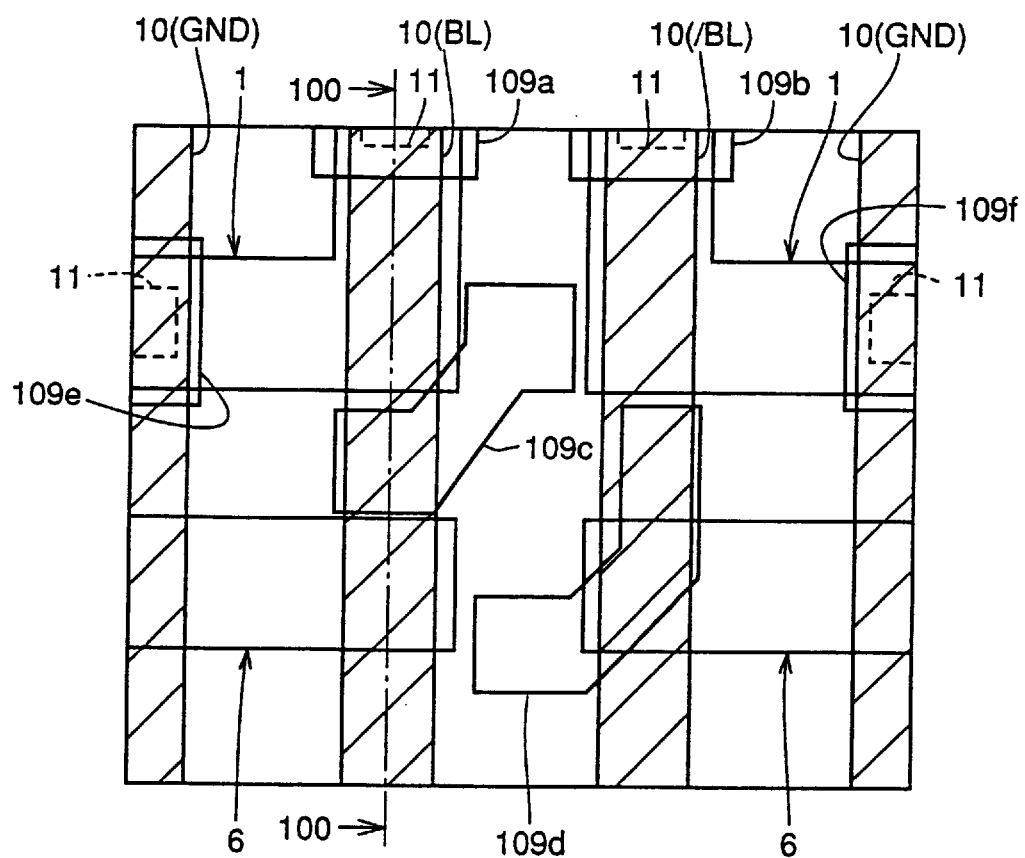

FIG. 1 shows an isolation region, an active region, first and second polysilicon layers, and a first polycontact. FIG. 2 shows an isolation region, an active region, second and third polysilicon layers, and a second polycontact. FIG. 3 shows an isolation region, an active region, a third polysilicon layer, a contact, and a metal wiring.

Referring to FIG. 1, a memory cell of an SRAM according to a first embodiment of the present invention has an access transistor Q1 and a driver transistor Q3 formed in a common N type MOS active region 1. Similarly, an access transistor Q2 and a driver transistor Q4 are formed in a common N type MOS active region 1. A gate electrode 3a of a first polysilicon layer is formed so as to constitute the gate electrodes of driver transistor Q3 and load transistor Q5. A gate electrode 3b of a first polysilicon layer is formed so as to constitute the gate electrode of driver transistor Q4 and load transistor Q6. A word line 9a of a second polysilicon layer is formed so as to implement the gate electrode of access transistors Q1 and Q2.

A connection wiring 9b of a second polysilicon layer is formed so as to electrically connect N type MOS active region 1 common to access transistor Q1 and driver transistor Q3 with P type MOS active region 6 of load transistor Q5 via first polycontact 7. A connection wiring 9c of the second polysilicon layer is formed so as to electrically connect N type MOS active region 1 common to access transistor Q2 and driver transistor Q4 with P type MOS active region 6 of load transistor Q4 via first polycontact 7. A Vcc wiring (power supply wiring) 9d of the second polysilicon layer is formed so as to be electrically connected to P type MOS active region 6 of load transistors Q5 and Q6 via first polycontact 7.

According to the first embodiment, gate electrodes 3a and 3b can be overlapped with word line 9a in a planar manner by forming driver transistors Q3, Q4 and load transistors Q5, Q6 by gate electrodes 3a and 3b of the first polysilicon layer and word line 9a serving in common as the gate electrode of access transistors Q1 and Q2 by a second polysilicon layer. Therefore, the memory cell size can be reduced in comparison with the conventional implement where the gate electrodes of all the transistors are formed of the first polysilicon layer.

Referring to FIG. 2, a third polysilicon layer 109c is formed so as to connect connection wiring 9b of the second polysilicon layer with gate electrode 3b (refer to FIG. 1) of the first polysilicon layer via second polycontact 108. Similarly, a connection wiring 109d of the third polysilicon layer is formed so as to connect connection wiring 9c with gate electrode 3a (refer to FIG. 1) via second polycontact 108. Pad layers 109a and 109b of the third polysilicon layer are formed at the source/drain regions of access transistors Q1 and Q2 via second polycontact 108. Also, pad layers 109e and 109f of the third polysilicon layer are formed at the active regions of driver transistors Q3 and Q4 via second polycontact 108.

Referring to FIG. 3, a pair of bit lines (BL, /BL) 10 extending in a predetermined direction is formed so as to provide contact with pad layers 109a and 109b via a contact 11. GND wirings (ground wirings) 10 extending in respective predetermined directions are formed on respective pad layers 109e and 109f via contact 11. These ground wirings 10 and the pair of bit lines 10 are formed of metal wirings.

A sectional structure of a memory cell region of the SRAM of the first embodiment will be described hereinafter with reference to FIG. 4. Field oxide film 106 for element isolation is formed in a predetermined region at the main surface of semiconductor substrate 101. A P well 102 is formed in a region where the NMOS transistor is formed at the main surface of semiconductor substrate 101. A P$^+$ isolation region 5 is formed in a buried manner in P well 102 so as to prevent generation of latch up and to isolate N type MOS transistors from each other. Furthermore, a pair of N type source/drain regions 1a having a predetermined distance therebetween to define a channel region is formed at the main surface of P well 102. Gate electrode 9a of access transistors Q1 and Q2 is formed on the channel region with a gate oxide film 110 therebetween. Gate electrode 9a is formed of the second polysilicon layer. Pad layer 109a of the third polysilicon layer is formed so as to come into contact with one N type source/drain region 1a. Bit line 10 is electrically connected to that pad layer 109a via contact 11. Furthermore, a shallow N well 105 is formed at the surface of semiconductor substrate 101 with a predetermined distance from P well 102. A p type source/drain region 6a is formed on a surface of N well 105. Connection wiring 9b of the second polysilicon layer is formed so as to electrically connect P type source/drain region 6a with N type source/drain region 1a. It is to be noted that connection wiring 9b is formed on field oxide film 106 with gate oxide film 110 therebetween. Connection wiring 109c of the third polysilicon layer is formed at a predetermined region on connection wiring 9b. Gate electrode 3a of load transistor Q5 and driver transistor Q3 is formed on field oxide film 106 with gate oxide film 110 therebetween.

Figure 5:
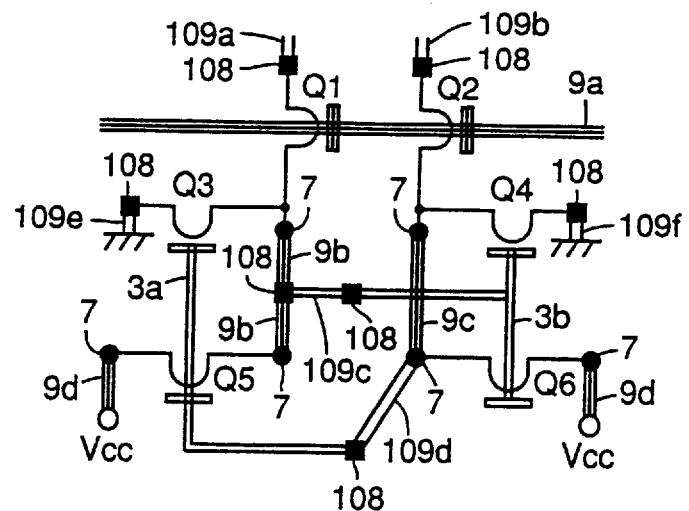
FIG. 5 is an equivalent circuit diagram corresponding to the plan layout of the memory cell shown in FIGS. 1–3.
Figure 6:
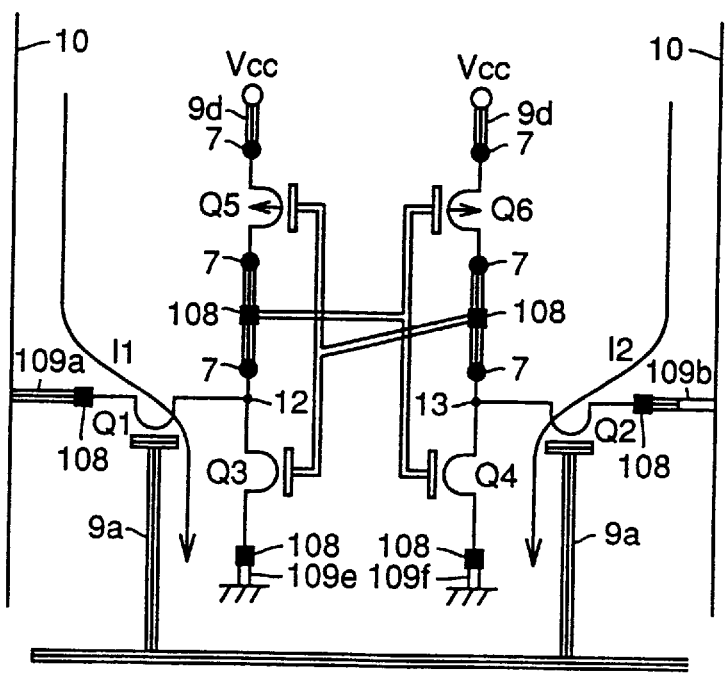
FIG. 6 is an equivalent circuit diagram of FIG. 5 rewritten as a conventional general equivalent circuit diagram.
Figure 23:
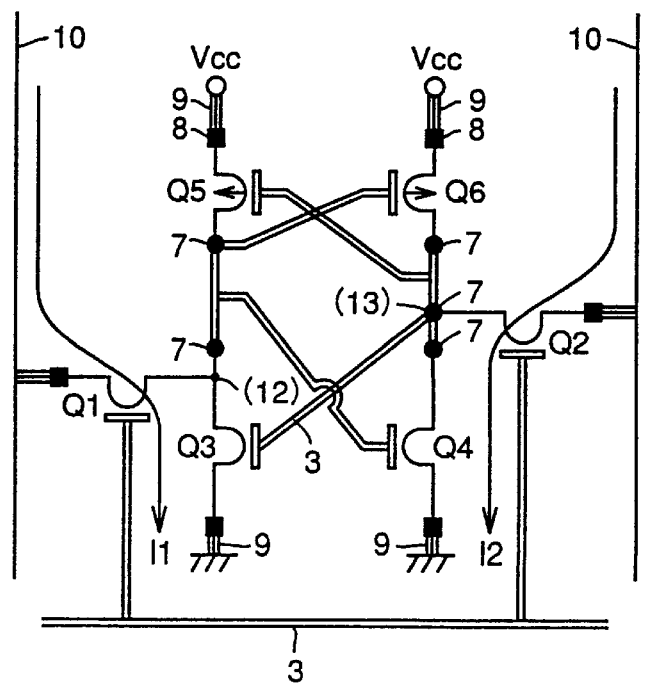
FIG. 23 is an equivalent circuit diagram of FIG. 20 rewritten into a general version as in FIG. 19.

It is appreciated from FIGS. 5 and 6 that first polycontact 7 is not present in current paths I1 and I2 in the memory cell of the first embodiment. This means that the resistance value will not differ between current paths I1 and I2 as in a conventional memory cell shown in FIG. 23. Therefore, electrical imbalance of the memory cell can be eliminated in the first embodiment. Furthermore, since the contacts with respect to storage nodes 12 and 13 are arranged electrically symmetric on an equivalent circuit, balanced electrical characteristics can be obtained.

By forming bit line 10 and GND wiring 10 only by a metal wiring and Vcc wiring 9d by the second polysilicon layer according to the layout in the memory cell of the first embodiment, the pair of bit lines and the ground wiring can be formed on the layout with no difficulty. In the memory cell of the first embodiment, the current flow of load transistors Q5 and Q6 through Vcc is set smaller than the cell current flowing towards ground via access transistors Q1 and Q2 and driver transistors Q3 and Q4. Therefore, the voltage drop according to a parasitic resistance is greater at the ground side. Thus, there is no problem in forming Vcc wiring 9d by a second polysilicon layer having a resistance higher than that of the metal wiring, and forming ground wiring 10 and the bit line pair 10 by a metal wiring having low resistance.

In the above-described first embodiment, the second polysilicon layer constituting gate electrode 9a of the access transistor, connection wirings 9b and 9c, and Vcc wiring 9d may be formed of a polycide structure including a polysilicon layer and a metal silicide layer formed thereon. In this case, the above-described first and third polysilicon layers are not provided in a polycide structure, and polysilicon layers are used. More specifically, the second polysilicon layer used for the Vcc power supply must be low in resistance in order to prevent reduction in the Vcc potential due to parasitic resistance. Therefore, the second polycide layer is used instead of the second polysilicon layer. However, the usage of a polycide layer for all the first to third polysilicon layers will result in increase in the thickness of all the layers to result in a greater stepped portion. For the purpose of reducing the stepped portion while preventing a drop in the Vcc potential, only the second polysilicon layer is changed to the second polycide layer. Since this second polysilicon layer is also used as the gate electrode of a transistor in the peripheral circuit not shown, the operating rate of the transistor of the periphery circuit can be increased by adapting a polycide structure having low resistance for the second polysilicon layer. Thus, a high speed SRAM with a small stepped portion can be realized.

SECOND EMBODIMENT

Figure 4:
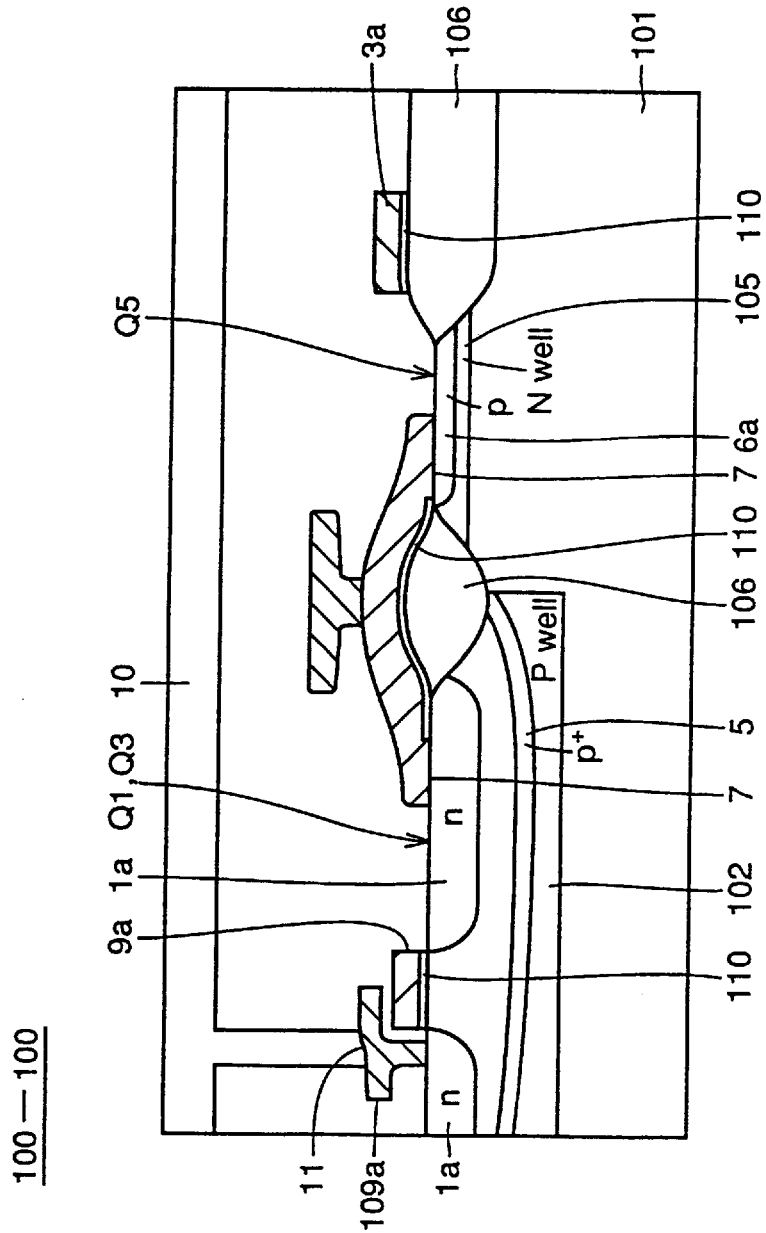
FIG. 4 is a sectional view of the memory cell of FIGS. 1–3 taken along line 100—100.
Figure 7:
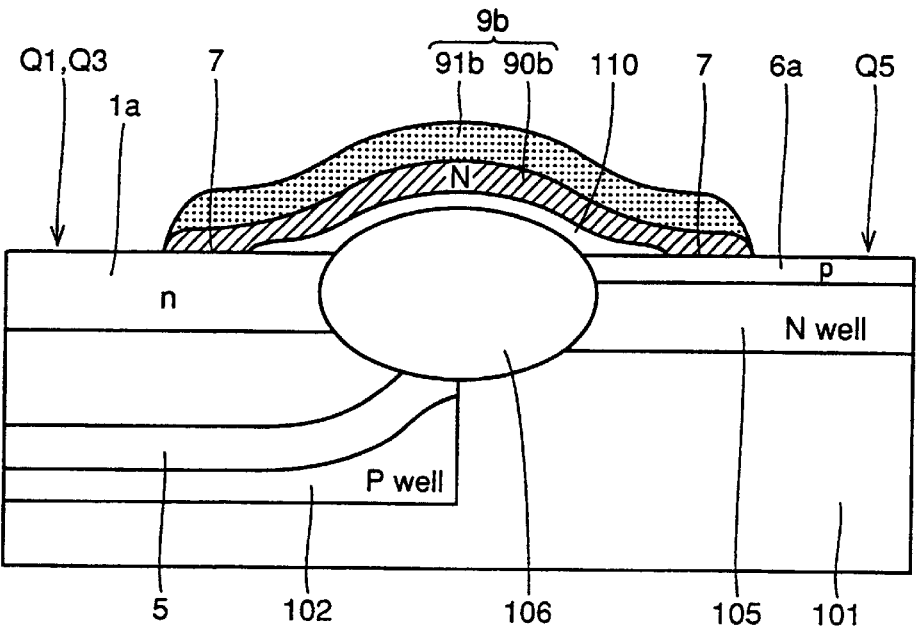
FIG. 7 is a sectional view of a comparative memory cell for describing a memory cell according to a second embodiment of the present invention.
Figure 8:
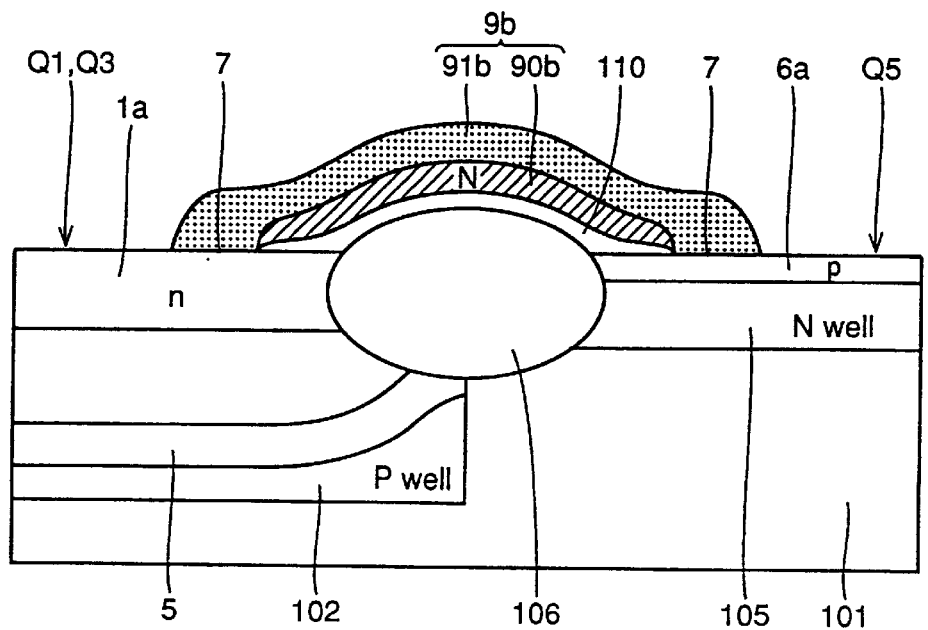
FIG. 8 is a sectional view of the memory cell of the second embodiment.
Figure 24:
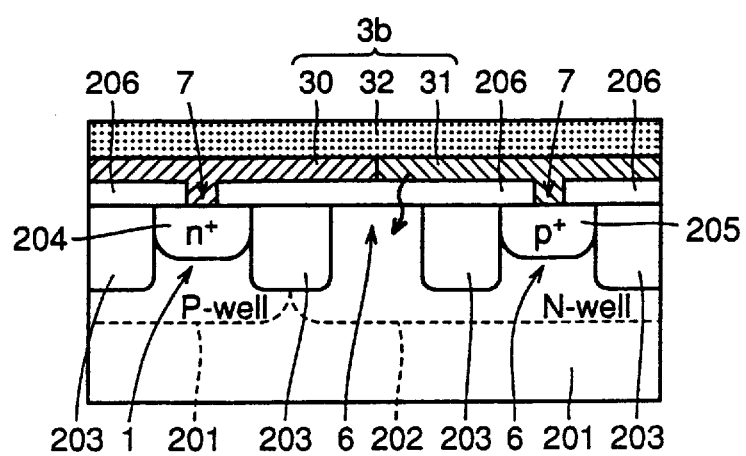
FIG. 24 is a sectional view of the memory cell of FIG. 20 taken along line 200—200.

The sectional views of FIGS. 7 and 8 are enlargements of connection wiring 90b between P type source/drain region 6 and N type source/drain region 1a shown in FIG. 4. The present second embodiment has connection wiring 9b implemented by a polycide layer including an N type polysilicon layer 90b and an WSi layer 91b formed thereon. In this case, N type polysilicon layer 90b forms direct contact with the surface of P type source/drain region 6a and the surface of N type source/drain region 1a in first polycontact 7. Therefore, there was a problem that a PN junction is formed as the contacting portion between N type polysilicon layer 90b and P type source/drain 6a. A conventional implement employs a dual gate structure as shown in FIG. 24 for this purpose. However, the usage of a dual gate structure provides various problems as described above such as reduction in the threshold voltage. In the second embodiment of FIG. 8, only WSi layer 91b forming the polycide structure is brought into direct contact with the surface of P type source/drain region 6a and N type source/drain region 1a, and N type polysilicon layer 90b is not brought into direct contact with P type source/drain region 6a and N type source/drain region 1a. It is therefore not necessary to adapt a dual gate structure. Thus, the various problems related in the usage of a dual gate structure are not encountered.

When N well 105 is formed more shallow than field oxide film 106 as shown in FIGS. 4 and 8 and when each N well 105 is independent, Vcc wiring 9d of FIG. 1 may be used as the fixed potential of N well 105. In this case, an N well contact should be established at A and B indicated in FIG. 1. As a result, the N well potential is stabilized, so that the latch up resistance can be improved.

Figure 9:
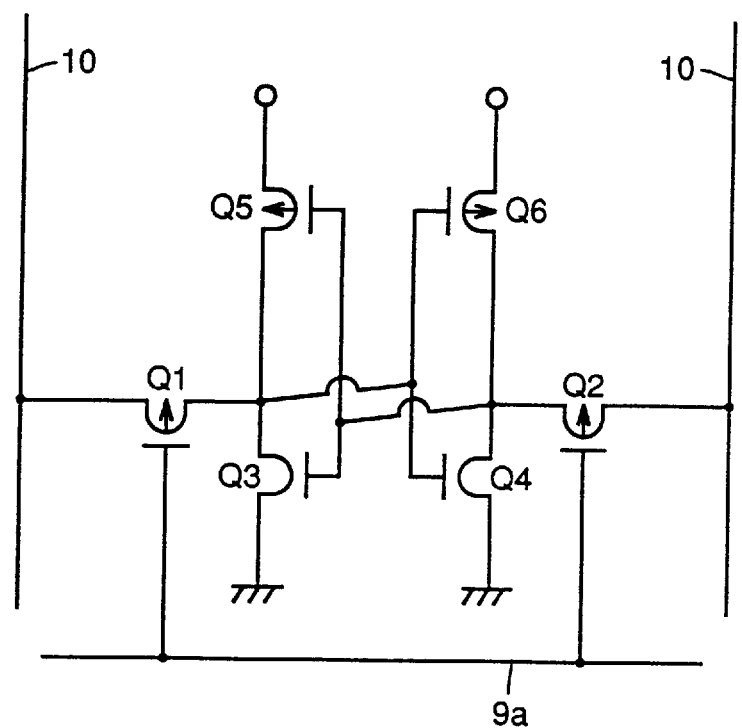
FIG. 9 is an equivalent circuit diagram showing a modification of the memory cell of the first and second embodiments.
Figure 10:
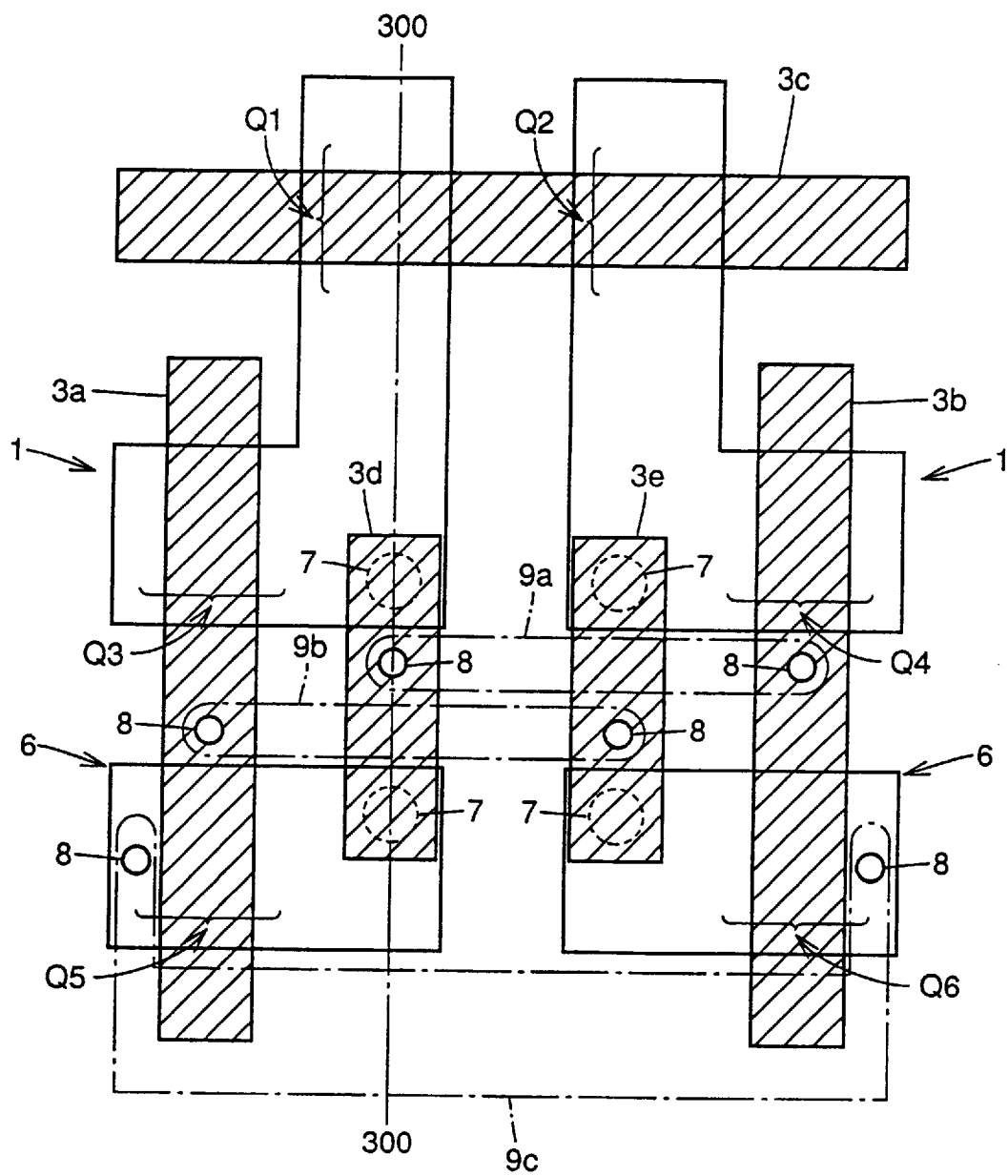
FIGS. 10 and 11 are plan layout showing a memory cell of a SRAM according to a third embodiment of the present invention.

The present invention is not limited to the above first and second embodiments in which access transistors Q1 and Q2 are formed of N type transistors. Access transistors Q1 and Q2 may be formed of P type transistors as shown in FIG. 9.

THIRD EMBODIMENT

Figure 11:
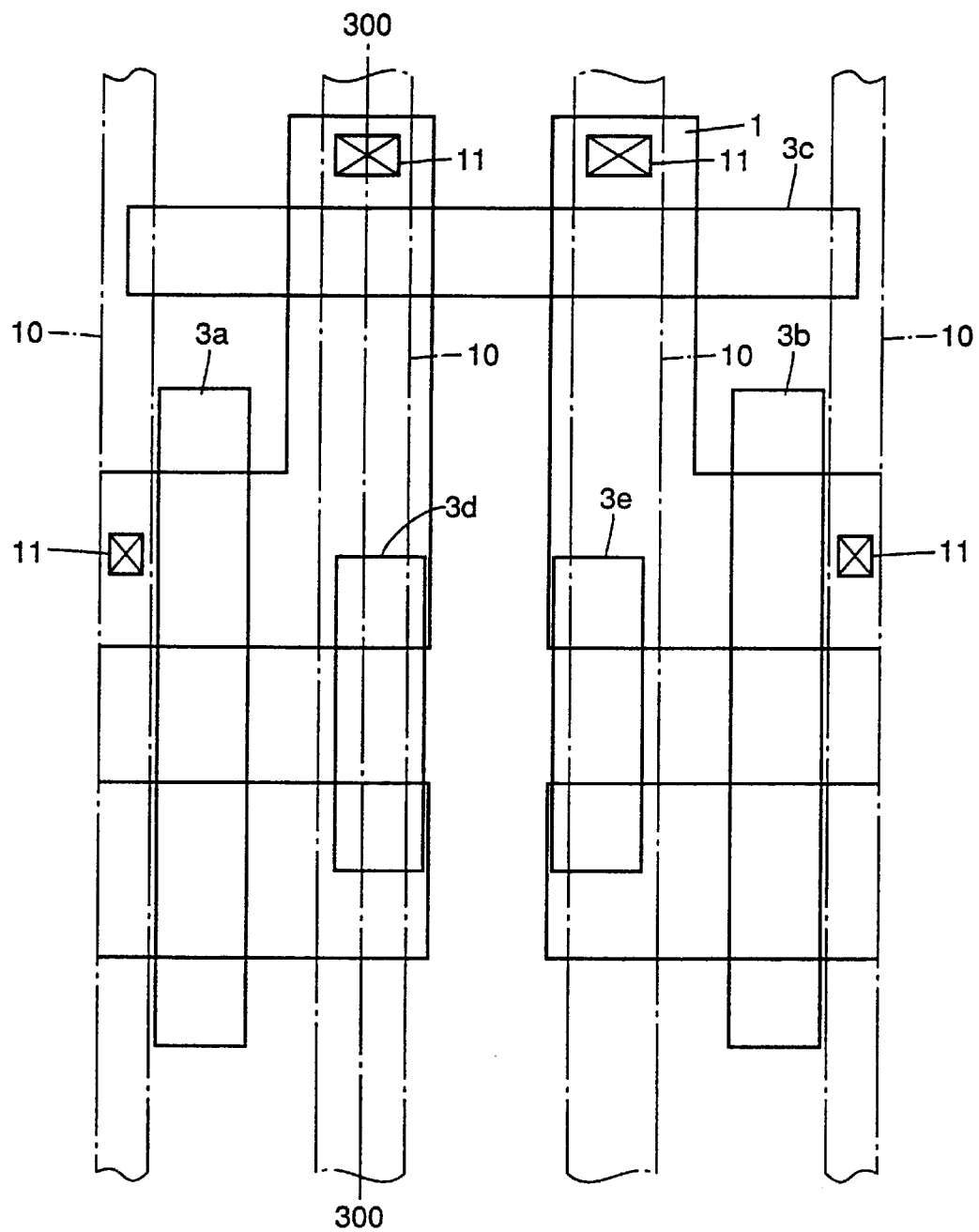

The structure of the third embodiment differs from the structure of the first embodiment in which a memory cell is formed of three polysilicon layers and one metal wiring layer in that a memory cell is formed of two polysilicon layers and one metal wiring layer. The third embodiment is advantageous over the first embodiment in that the number of layers forming the memory cell is reduced. The feature that there is no polycontact in the path of the cell current is identical to that of the first embodiment. In the third embodiment, gate electrode 3a of driver transistor Q3 and load transistor Q5, gate electrode 3b of driver transistor Q4 and load transistor Q6, word line 3c serving also as the gate electrode of access transistors Q1 and Q2, and connection wirings 3d and 3e connecting active regions 1 and 6 are formed of a first polycide layer corresponding to the first polysilicon layer of the first embodiment. Vcc wiring 9c, connection wiring 9a connecting connection wiring 3d with gate electrode 3b, and connection wiring 9b connecting connection wiring 3e with gate electrode 3a are formed of a second polycide layer. Furthermore, bit line pair 10 and ground wiring 10 are formed of a metal wiring as shown in FIG. 11. According to the third embodiment of the present invention, a memory cell is constituted of two polycide layers and one metal wiring layer.

Figure 12:
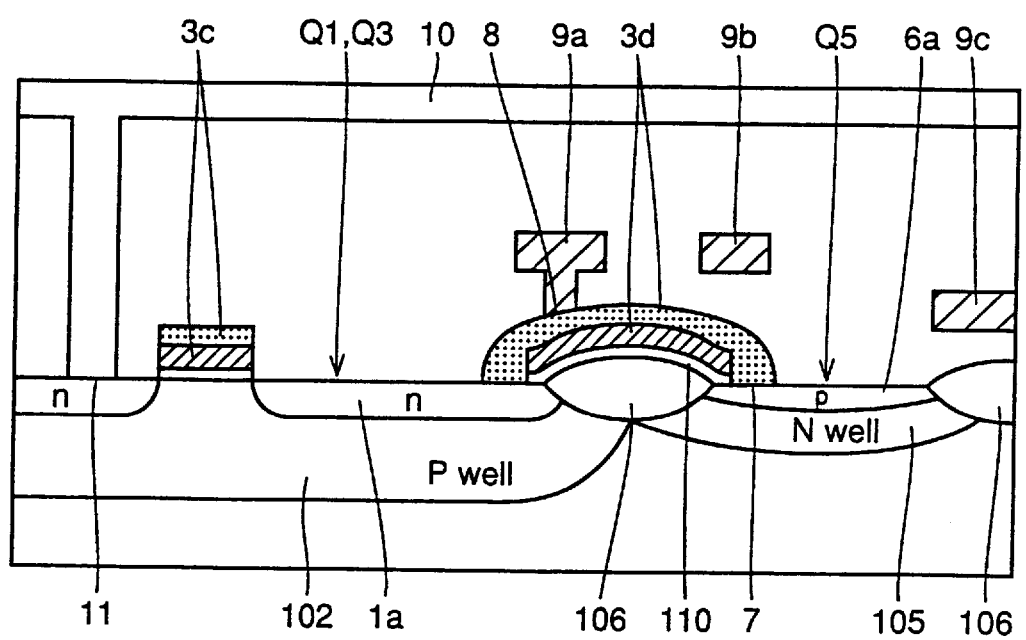
FIG. 12 is a sectional view of the memory cell of the third embodiment shown in FIGS. 10 and 11 taken along line 300—300.

The sectional structure of the memory cell of the third embodiment shown in FIG. 12 is basically similar to that of the first embodiment shown in FIG. 4 except for the following points. Word line 3c forming the gate electrode of an access transistor and connection wiring 3d connecting N type source/drain region 1a and P type source/drain region 6a are formed of a first polycide layer. Connection wiring 9a of the second polycide layer is formed at a predetermined region on connection wiring 3d via first polycontact 8. Connection wiring 9b of a second polycide layer is formed with a predetermined distance from connection wiring 9a. Vcc wiring 9c of the second polysilicon layer is formed above field oxide film 106.

FOURTH EMBODIMENT

Figure 13:
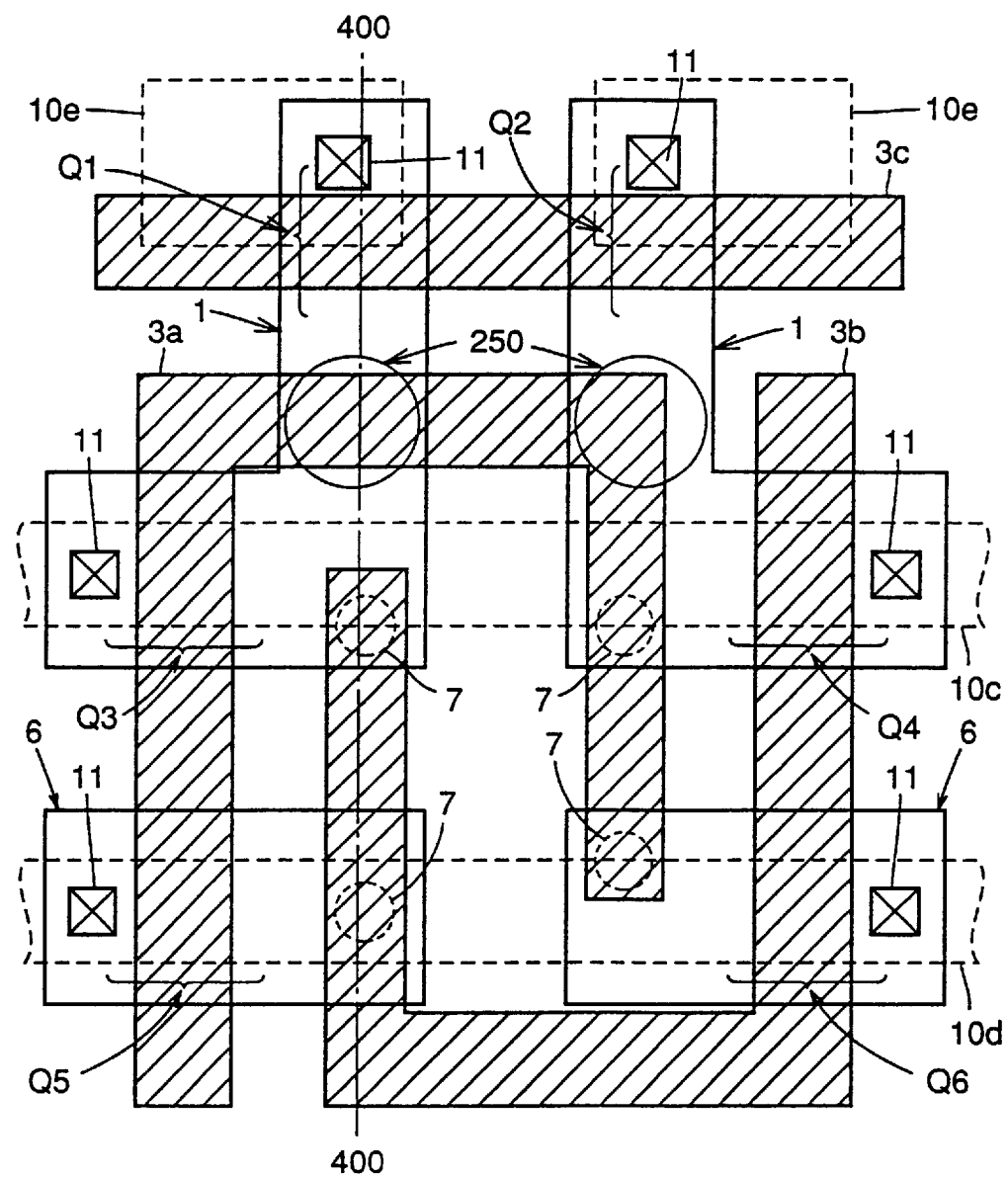
FIGS. 13 and 14 are plan layouts showing a memory cell of a SRAM according to a fourth embodiment of the present invention.
Figure 14:
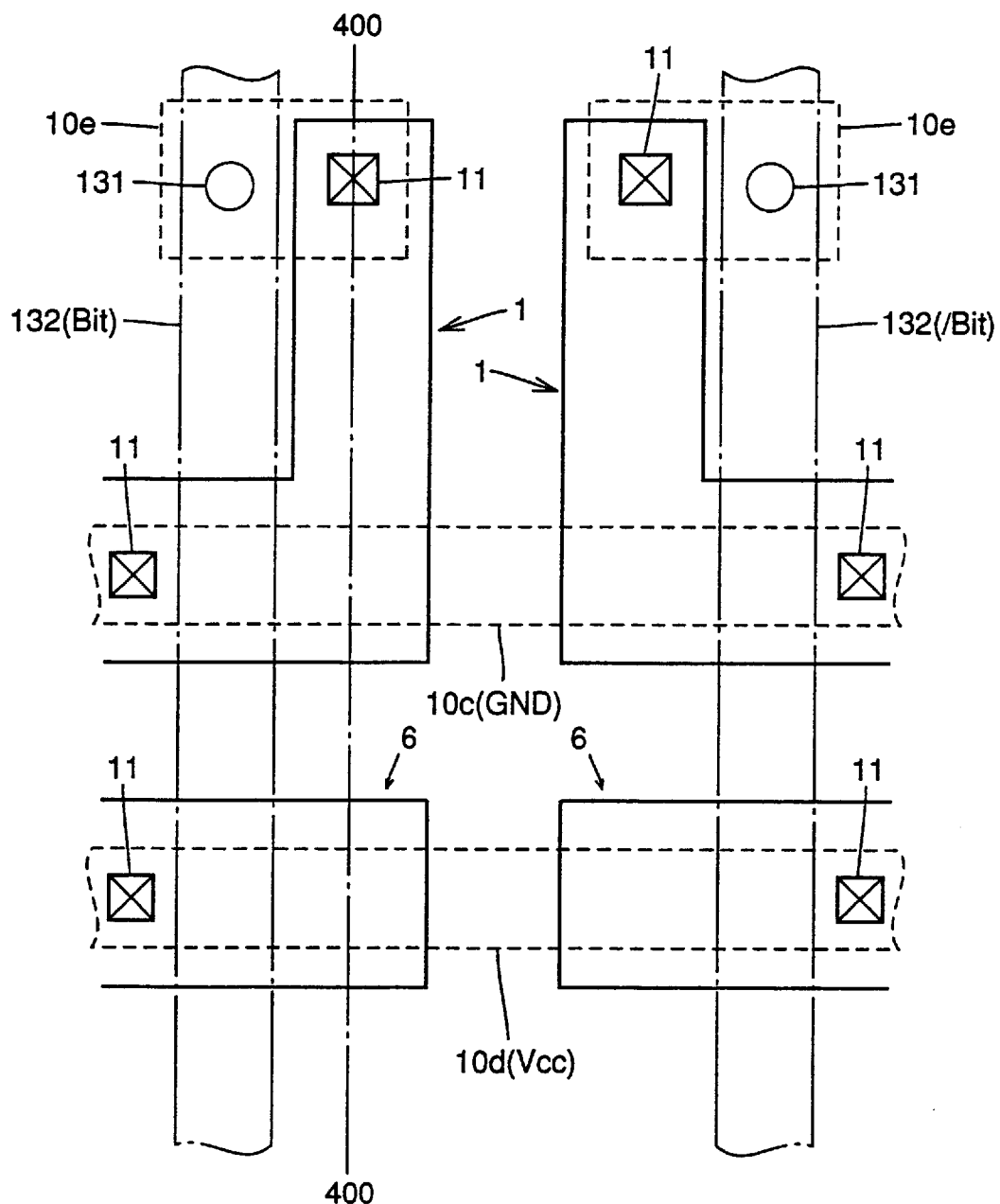

Referring to FIG. 13, a memory cell according to a fourth embodiment of the present invention is constituted of one polysilicon layer and two metal wiring layers. Therefore, the number of layers forming a memory cell is reduced in comparison to that of the memory cell of the first embodiment formed of three polysilicon layers and one metal wiring layer.

More specifically, as shown in FIG. 13, word line 3c serving also as the gate electrodes of access transistors Q1 and Q2, wiring layer 3a constituting the gate electrode of driver transistor Q3 and load transistor Q5 and the connection wiring of driver transistor Q4 and load transistor Q6, and wiring layers 3b constituting the gate electrode of driver transistor Q4 and load transistor Q6 and the connection wiring of driver transistor Q3 and load transistor Q5 are formed from the first polysilicon layer. Furthermore, pad layer 10e for a bit line, GND wiring 10c, and Vcc wiring 10d are formed from a first metal wiring layer, and a pair of bit lines 132 are formed from a second metal wiring layer. Wiring layers 3a and 3b are connected with active regions 1 and 6 via first polycontact 7. Pad layer 10e, GND wiring 10c and Vcc wiring 10d are connected with active regions 1 and 6 via contact 11. Bit line pair 132 and pad layer 15e are connected via a through hole 131.

According to the fourth embodiment of the present invention, a region 250 of wiring layer 3a does not function as a gate electrode of a transistor. Therefore, an N type impurity region for forming a source/drain region must be provided in advance prior to formation of wiring layer 3a in the region of active region 1 located beneath region 250. Electrical imbalance of a memory cell can be eliminated also in the fourth embodiment since a contact portion other than a bit line contact and a GND contact in the cell current path is not present, similar to the above-described first to third embodiments.

Figure 15:
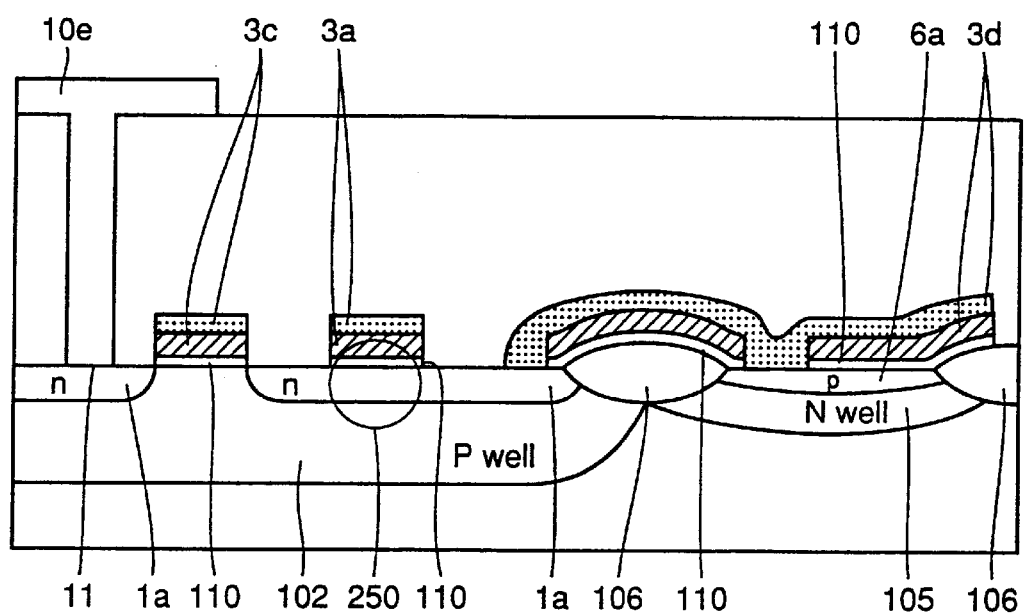
FIG. 15 is a sectional view of the memory cell of the fourth embodiment shown in FIGS. 13 and 14 taken along lines 400—400.

Referring to FIG. 15 showing a sectional view of the fourth embodiment, word line 3c functioning as a gate electrode and wiring layers 3a and 3b are formed of first polycide layers having a polycide structure. Furthermore, pad layer 10e of a first metal wiring layer is connected to source/drain region 1a of access transistor Q1 via contact 11.

FIFTH EMBODIMENT

Figure 16:
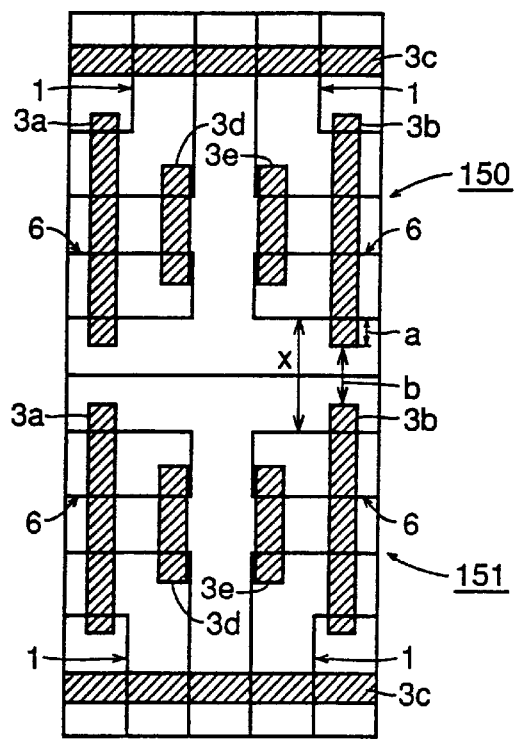
FIG. 16 is a plan view showing two memory cells of the third embodiments of FIG. 10 disposed.
Figure 17:
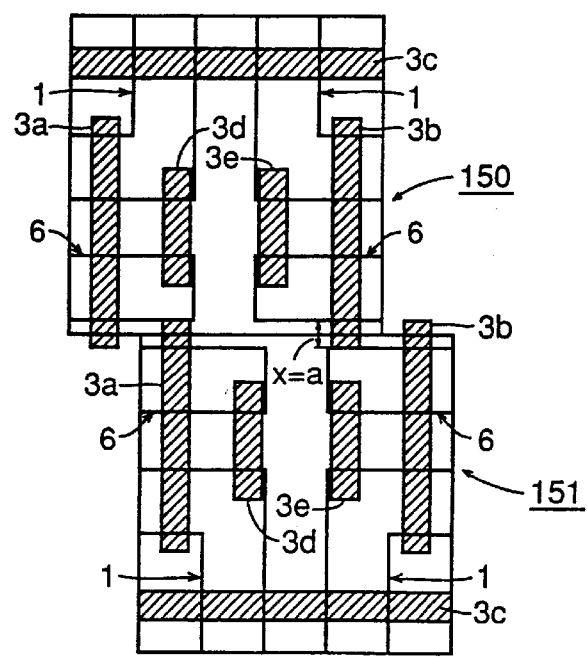
FIGS. 17 and 18 are plan views showing an arrangement of a memory cell according to fifth and sixth embodiments, respectively, of the present invention.

Referring to FIG. 16 showing a plan view of an arrangement of memory cells of the previous third embodiment, the distance (x) between respective active regions 6 of two memory cells 150 and 151 is represented by the sum of two times the overlapping margin (a) with respect to active region 6 of gate electrode b and the distance (b) between respective gate electrodes 3b. In contrast the extension of gate electrode 3b of memory cell 150 will not overlie the extension of gate electrode 3b of memory cell 151 by shifting the arrangement of memory cells 150 and 151 as shown in FIG. 17 of the present fifth embodiment. This means that the distance (x) between active region 6 of memory cell 150 and active region 6 of memory cell 151 can be made equal to (a). Thus, the integration density can be improved.

SIXTH EMBODIMENT

Figure 18:
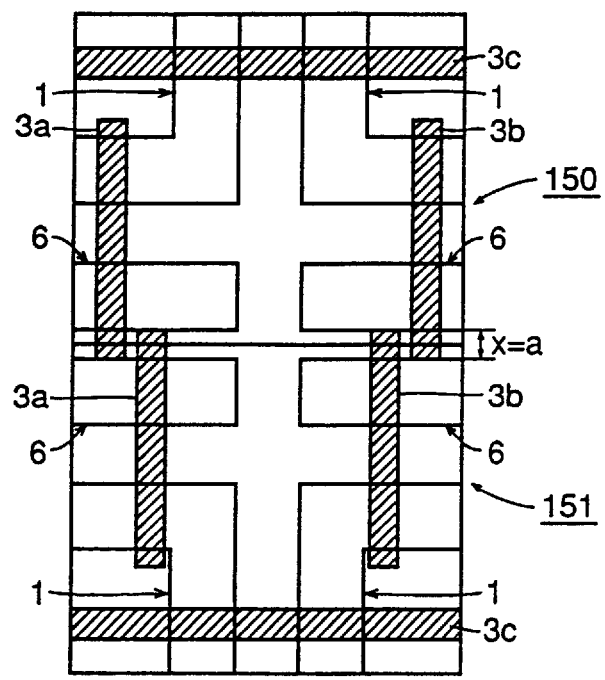
Figure 19:
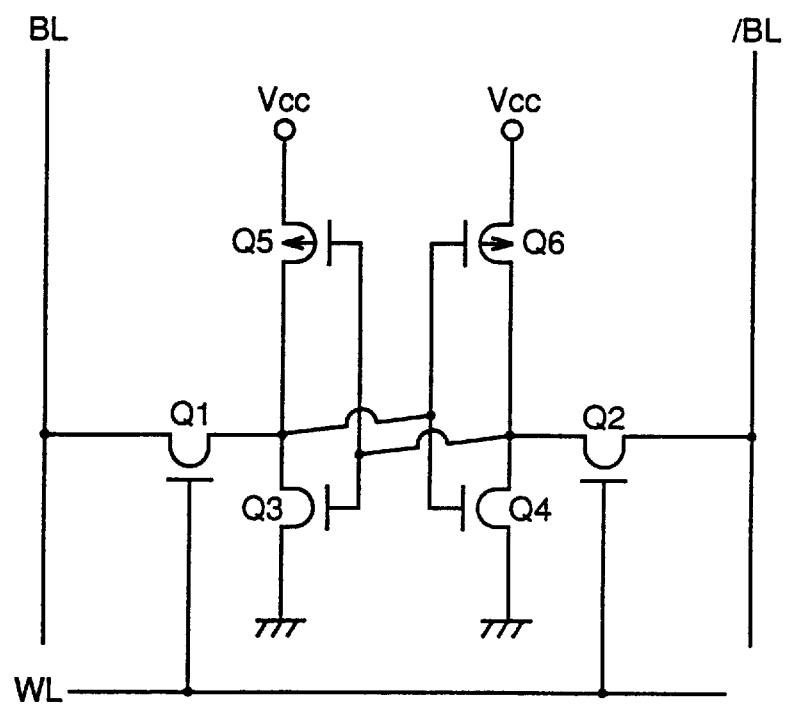
FIG. 19 is an equivalent circuit diagram of a memory cell of a conventional general SRAM.
Figure 20:
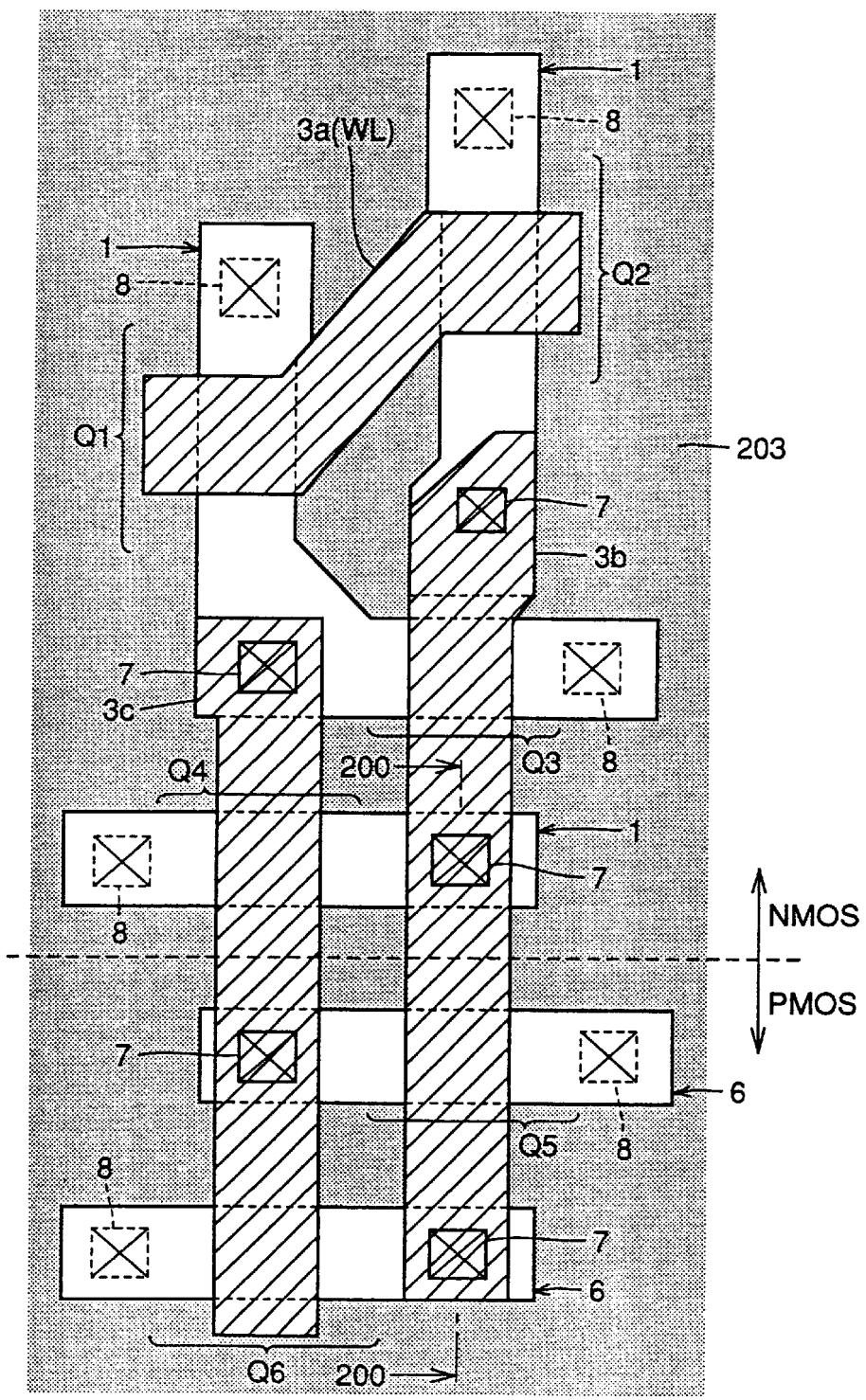
FIGS. 20 and 21 are plan layouts of a memory cell of a conventional SRAM.
Figure 21:
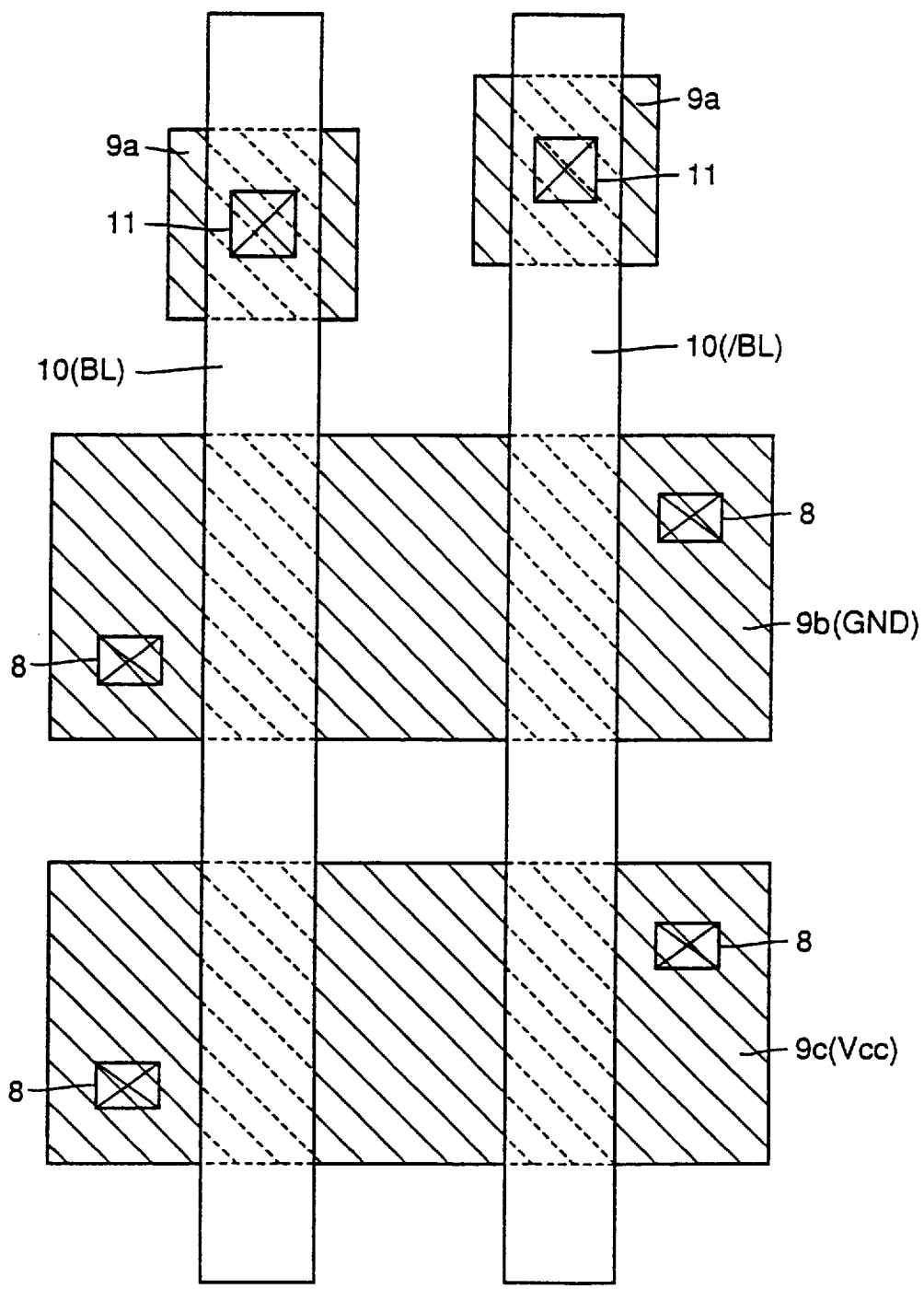
Figure 22:
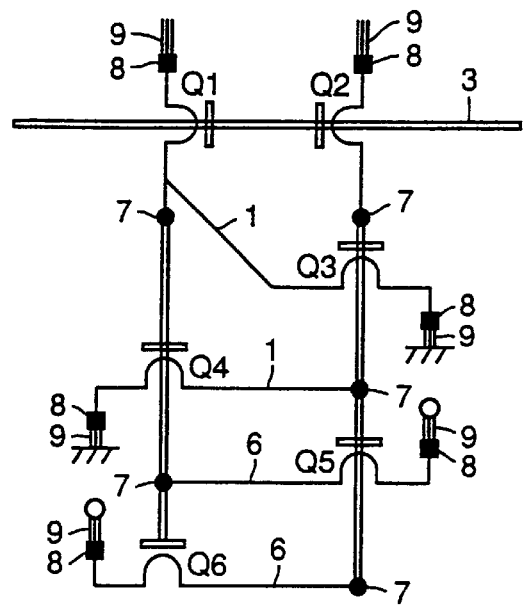
FIG. 22 is an equivalent circuit diagram corresponding to the layout of the conventional memory cell shown in FIGS. 20 and 21.

In the sixth embodiment of the present invention as shown in FIG. 18, gate electrode 3b of memory cell 150 and gate electrode 30b of memory cell 151 are arranged so that respective extensions do not overlap with each other without shifting the entire arrangement of memory cells 150 and 151. Therefore, the distance (x) between adjacent active regions 6 can be made equal to the overlapping margin (a) with respect to active region 6 of gate electrode 3b. Thus, the integration density can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having two driver transistors, two access transistors and two load transistors formed on a main surface of a semiconductor substrate corresponding to a memory cell region, said semiconductor memory device comprising:

a first conductive layer constituting a gate electrode of said driver transistor and a gate electrode of said load transistor, and including at least a first polysilicon layer, and a second conductive layer constituting a word line serving also as a gate electrode of said access transistor, a power supply wiring, and a connection wiring for connecting an active region of a first conductivity type transistor forming said driver transistor and said access transistor and an active region of a second conductivity type transistor forming said load transistor, and including at least a second polysilicon layer.

2. A semiconductor memory device having two driver transistors, two access transistors and two load transistors formed on a main surface of a semiconductor substrate corresponding to a memory cell region, said semiconductor memory device comprising:

a first conductive layer constituting a gate electrode of said driver transistor and a gate electrode of said load transistor, and including at least a first polysilicon layer, and a second conductive layer constituting a word line serving also as a gate electrode of said access transistor, a power supply wiring, and a connection wiring for connecting an active region of a first conductivity type transistor forming said driver transistor and said access transistor and an active region of a second conductivity type transistor forming said load transistor, and including at least a second polysilicon layer, wherein only a contact portion for a bit line and a contact portion for a ground wiring are present in a current path of said memory cell, and no other contact portion is present in said current path.

3. The semiconductor memory device according to claim 1, further comprising a third conductive layer constituting a pad layer for an upper metal wiring and a connection wiring in said memory cell, and including at least a third polysilicon layer.

4. The semiconductor memory device according to claim 1, further comprising a metal wiring layer constituting a bit line and a ground wiring.

5. The semiconductor memory device according to claim 1, wherein said first conductive layer is formed only of the first polysilicon layer, and wherein said second conductive layer comprises a polycide layer including said second polysilicon layer and a metal silicide layer formed in contact on said second polysilicon layer.

6. A semiconductor memory device having two driver transistors, two access transistors and two load transistors formed on a main surface of a semiconductor substrate corresponding to a memory cell region, said semiconductor memory device comprising:

a first conductive layer constituting a gate electrode of said driver transistor and a gate electrode of said load transistor, and including at least a first polysilicon layer, and a second conductive layer constituting a word line serving also as a gate electrode of said access transistor, a power supply wiring, and a connection wiring for connecting an active region of a first conductivity type transistor forming said driver transistor and said access transistor and an active region of a second conductivity type transistor forming said load transistor, and including at least a second polysilicon layer, wherein said first conductive layer is formed only of the first polysilicon layer, wherein said second conductive layer comprises a polycide layer including said second polysilicon layer and a metal silicide layer formed in contact on said second polysilicon layer, and said metal silicide layer in said second conductive layer is brought in direct contact with a first active region of said first conductivity type transistor and a second active region of said second conductivity type transistor, and said second polysilicon layer in said second conductive layer does not directly contact said first and second active regions.

7. The semiconductor memory device according to claim 5, wherein said power supply wiring formed of said second conductive layer is electrically connected to an N type well region having a source/drain region of said load transistor formed therein.

8. The semiconductor memory device according to claim 1, wherein contact portions of said first and second conductive layers are arranged electrically symmetrical on an equivalent circuit with respect to two storage nodes of said memory cell.

* * * * *